United States Patent
Rischke et al.

(10) Patent No.: US 6,234,382 B1
(45) Date of Patent: May 22, 2001

(54) METHOD AND DEVICE FOR BONDING SOLDER BALLS TO A SUBSTRATE

(75) Inventors: Jörg Werner Rischke, Veldhoven; Hugo Franklin Menschaar, Knegsel; Robert Kloosterboer, 's-Hertogenbosch, all of (NL)

(73) Assignee: Meco Equipment Engineers B.V., Drunen (NL)

( * ) Notice: Subject to any disclaimer, the term of this patent is extended or adjusted under 35 U.S.C. 154(b) by 0 days.

(21) Appl. No.: 09/060,849

(22) Filed: Apr. 16, 1998

(30) Foreign Application Priority Data

Jun. 20, 1997 (NL) .................................. 1006366

(51) Int. Cl.⁷ .......................... B23K 35/12; B23K 31/02
(52) U.S. Cl. ........................................ 228/245; 228/41
(58) Field of Search ........................ 228/245, 246, 228/180.22, 212, 213, 41

(56) References Cited

U.S. PATENT DOCUMENTS

| | | |
|---|---|---|
| 3,952,697 | 4/1976 | Bonkoske . |
| 4,951,401 | 8/1990 | Suzuki et al. . |
| 5,090,609 | 2/1992 | Nakao et al. . |
| 5,279,045 * | 1/1994 | Odashima et al. ............... 34/10 |
| 5,431,332 | 7/1995 | Kirby et al. . |
| 5,442,852 | 8/1995 | Danner . |
| 5,499,487 | 3/1996 | McGill . |
| 5,526,978 * | 6/1996 | Nagatsuka et al. ............ 228/219 |
| 5,551,148 | 9/1996 | Kazui et al. . |
| 5,551,216 | 9/1996 | McGill . |
| 5,574,668 * | 11/1996 | Beaty ............................. 364/558 |
| 5,593,080 | 1/1997 | Teshima et al. . |
| 5,680,746 * | 10/1997 | Hornisch ......................... 53/475 |
| 5,831,247 * | 11/1998 | Hidaka ............................. 219/388 |
| 6,003,757 * | 12/1999 | Beaumont et al. .............. 228/246 |
| 6,095,403 * | 8/2000 | Akin et al. .................... 228/180.1 |
| 6,119,927 * | 9/2000 | Ramos et al. ................... 228/254 |
| 6,143,374 * | 11/2000 | Cairncross et al. ............. 427/533 |

FOREIGN PATENT DOCUMENTS

| | | |
|---|---|---|
| 0 461 961 | 12/1991 | (EP) . |
| 0 471 619 | 2/1992 | (EP) . |
| 403163894 * | 7/1991 | (JP) . |
| 07307561 * | 11/1995 | (JP) . |
| 8-56071 | 2/1996 | (JP) . |
| 08242070 * | 9/1996 | (JP) . |
| 10116833 * | 5/1998 | (JP) . |

* cited by examiner

Primary Examiner—Tom Dunn
Assistant Examiner—Kiley Stoner
(74) Attorney, Agent, or Firm—Oblon, Spivak, McClelland, Maier & Neustadt, P.C.

(57) ABSTRACT

The invention relates to a method and a device for bonding solder balls to connecting points which are provided on a substrate in a predetermined pattern. The solder balls are placed into holes provided in a plate-shaped element, which holes are each capable of accommodating one solder ball, and which are provided in the plate-shaped element in a pattern which corresponds with the pattern of the connecting points on the substrate. A combination of at least one substrate and a plate-shaped element containing solder balls is passed, by means of a conveying element, through a housing in which the solder balls are subjected to a heat treatment. The combinations, which each consist of at least one plate-shaped element and at least one substrate, are passed through the housing by the conveying element via lock mechanisms disposed near an inlet and near an outlet of the housing. Inside the housing the solder balls are placed into the holes provided in the plate-shaped element.

8 Claims, 13 Drawing Sheets

METHOD AND DEVICE FOR BONDING SOLDER BALLS TO A SUBSTRATE

The invention relates to a method for bonding solder balls to connecting points which are provided on a substrate in a predetermined pattern, wherein the solder balls are placed into holes provided in a plate-shaped element, which holes are each capable of accommodating one solder ball, and which are provided in said plate-shaped element in a pattern which corresponds with the pattern of the connecting points on the substrate, and wherein a combination of at least one substrate and a plate-shaped element containing solder balls is passed, by means of a conveying element, through a housing in which the solder balls are subjected to a heat treatment so as to be bonded to the substrate.

U.S. Pat. No. 5,442,852 describes a method for placing balls onto a substrate, wherein a membrane-like element is bonded to the substrate, which membrane-like element is provided with holes in a pattern which corresponds with the pattern of the connecting points on the substrate. Then solder balls can be picked up by means of an element which comprises a number of nozzles, which corresponds with the number of holes, which nozzles are arranged in such a manner as to correspond with the pattern of the holes, by generating a sub-atmospheric pressure in said nozzles, and the solder balls that have been picked up in this manner can be placed into the holes in the membrane that has been bonded to the substrate. The combination of substrate, carrier and solder balls thus obtained must subsequently be heated in order to melt the solder balls, so that the solder balls will bond to the connecting points. The means for carrying out this heating step cannot be derived from said U.S. Pat. No. 5,442,852.

U.S. Pat. Nos. 5,499,487 and 5,551,216 disclose devices for placing solder balls into plate-shaped elements which are provided with recesses for receiving solder balls. Said recessed plate-shaped elements are thereby fixed, together with a further plate-shaped element provided with through holes, to a supporting member which rotates about a horizontal axis of rotation, in such a manner that the two plate-shaped elements are spaced apart by some distance. Then the supporting element is caused to rotate with a view to rotating the plate-shaped element provided with through holes through a container in which solder balls are present, so as to place a solder ball into each of said through holes. Then the two plate-shaped elements are moved together and rotated by means of said supporting element, in such a manner that the recessed plate-shaped element will be positioned under the plate-shaped element provided with through holes, so that the solder balls will be transferred to the recesses of the respective plate-shaped element. The solder balls thus placed into the recessed plate-shaped element as intended can then be joined to a substrate comprising connecting points in some manner which is not described in detail in the aforesaid patent specifications.

U.S. Pat. No. 5,551,148 describes a method for placing solder balls onto a substrate, wherein a membrane-like element is used, which is provided with holes arranged in a predetermined pattern, which holes are filled with a soldering material or the like. Said membrane-like element is placed onto a substrate, in such a manner that the soldering material present in the holes will be positioned opposite the connecting points provided on the substrate. Said soldering material can be transferred to the connecting points by heating and pressing down said soldering material. All this is shown only diagrammatically in the said publication.

Japanese patent application No. 06209415 (publication No. 08056071) furthermore describes a method for providing solder balls, wherein an apertured plate is placed on a substrate. Then a frame-shaped member is placed on the apertured plate, and solder balls are deposited on the plate within the boundaries of said frame-shaped member.

Then the assembly of substrate, plate and frame and the solder balls accommodated therein is tilted in various directions and/or vibrated, in order to place a solder ball into each hole in the plate. Following that the frame and the excess balls are removed, and the substrate and the plate present thereon are passed through an oven in order to cause the solder balls to bond to the substrate.

From U.S. Pat. No. 4,951,401 and European patent applications Nos. 0 461 961 and 0 471 619 devices are known which are provided with endless conveyors, which are guided by pulley elements in such a manner that the conveyor moves along two substantially horizontal, superposed paths. The part of the endless conveyor that moves along the upper horizontal path is thereby passed through an oven construction. Substrates are placed on the upstream end of said upper part so as to be passed through the oven in order for the soldering material present on said substrates to be melted. The substrates must be removed at the end of said upper part.

U.S. Pat. No. 5,431,332 likewise describes a method for positioning solder balls on a substrate by means of an apertured membrane fixed to the substrate, wherein the solder balls are bonded to the substrate by means of a flux. Said patent specification thereby indicates that a substrate present on a pallet can be passed through an oven by means of a roller conveyor after removal of the apertured membrane. Said patent specification does not indicate how all this could be carried out in a controlled manner.

From the foregoing it will be apparent that according to prior art the correct positioning of solder balls and the bonding of said solder balls to a substrate are subdivided into a number of separate, usually complicated steps, whereby besides said separate steps known from the various publications, additional measures will have to be taken and means will be required for transferring the various products from one processing step to the other.

Usually the use of a flux for bonding the solder balls to the substrate is necessary thereby. The use of a flux generally leads to contamination of the substrates, however, so that a cleaning step is required after the soldering of the balls. Furthermore it is very difficult to apply the correct amount of flux at the location of the connecting points.

The object of the invention is to obtain a method of the kind referred to in the introduction, wherein the above drawbacks can be overcome.

According to the invention this objective can be accomplished in that the combinations, which each consist of at least one plate-shaped element and at least one substrate, are passed through said housing by said conveying element via lock mechanisms disposed near an inlet and near an outlet of the housing, in which housing a desired atmosphere is maintained, whilst inside the housing the solder balls are placed into the holes provided in said plate-shaped element.

By using this method it is possible to effect a continuous process of placing solder balls and bonding them in a sealed desired atmosphere, whereby it is generally possible to refrain from using a flux, in particular if the oxide film has been removed from the solder balls that are supplied.

According to another aspect of the invention the conveying element is made to move along two paths, one extending above the other, and on a part of the conveying element that follows a first one of said two superposed paths, at least one substrate is placed on a plate-shaped element supported by said conveying element, after which the combination thus formed, which consists of a plate-shaped element and at least one substrate, is moved by the conveying element and turned upside down at the transition to a second one of said two superposed paths, after which it is moved along the second path through the housing, whilst solder balls are supplied to the combination of a plate-shaped element and at least one substrate near the beginning of said second path, in a position of said combination in which the plate-shaped element is at least substantially positioned above said at least one substrate.

When this method is used, substrates can be continuously placed on plate-shaped elements, and solder balls can then be correctly oriented with respect to the substrates by means of said plate-shaped elements, after which the plate-shaped elements, the substrates and the solder balls can be moved through the housing so as to cause said solder balls to bond to the connecting points on the substrates. By using this method it becomes possible to achieve a very simple and quick positioning and bonding of the solder balls to a substrate, wherein a controlled transport of plate-shaped elements, substrates and solder balls can be effected by means of the conveyor.

The invention furthermore relates to a method for placing solder balls on connecting points provided on a substrate in a predetermined pattern, wherein the substrate is combined, on the side of the substrate onto which the balls are to be provided, with a plate-shaped element, in which holes are provided in a pattern which corresponds with the pattern of the connecting points on the substrate, all this in such a manner that the holes in the plate-shaped element will be positioned opposite the connecting points. According to the invention the combination of plate-shaped element and substrate, with the plate-shaped element lying on top of the substrate, is moved along a curvilinear path, in such a manner that the combination moves below the level of the centre(s) of curvature of said curvilinear path, whilst a number of solder balls are present on the combination. In practice it has become apparent that the solder balls, which roll over the plate-shaped element during operation, thereby fill the holes provided in the plate-shaped element in an effective manner, whereby a possibility can be created for moving combinations of substrates and plate-shaped elements continuously along the respective curvilinear path so as to achieve an efficient production of substrates, on which solder balls have been placed in correctly arranged relationship.

Another aspect of the invention relates to a device which is particularly suitable for carrying out a method according to the invention, which device is provided with a conveying element, by means of which a combination of a plate-shaped element containing solder balls and at least one substrate can be moved through a housing which forms part of the device, which housing is provided with means by which the solder balls can be subjected to a heat treatment.

According to the invention lock mechanisms are provided near an inlet and near an outlet of the housing, through which the conveying element can move into and out of said housing in a continuous manner, whilst means for supplying solder balls to the plate-shaped element are provided inside said housing.

The invention will be explained in more detail hereafter with reference to the accompanying figures, which diagrammatically illustrate possible embodiments of a device according to the invention.

Figure 10:
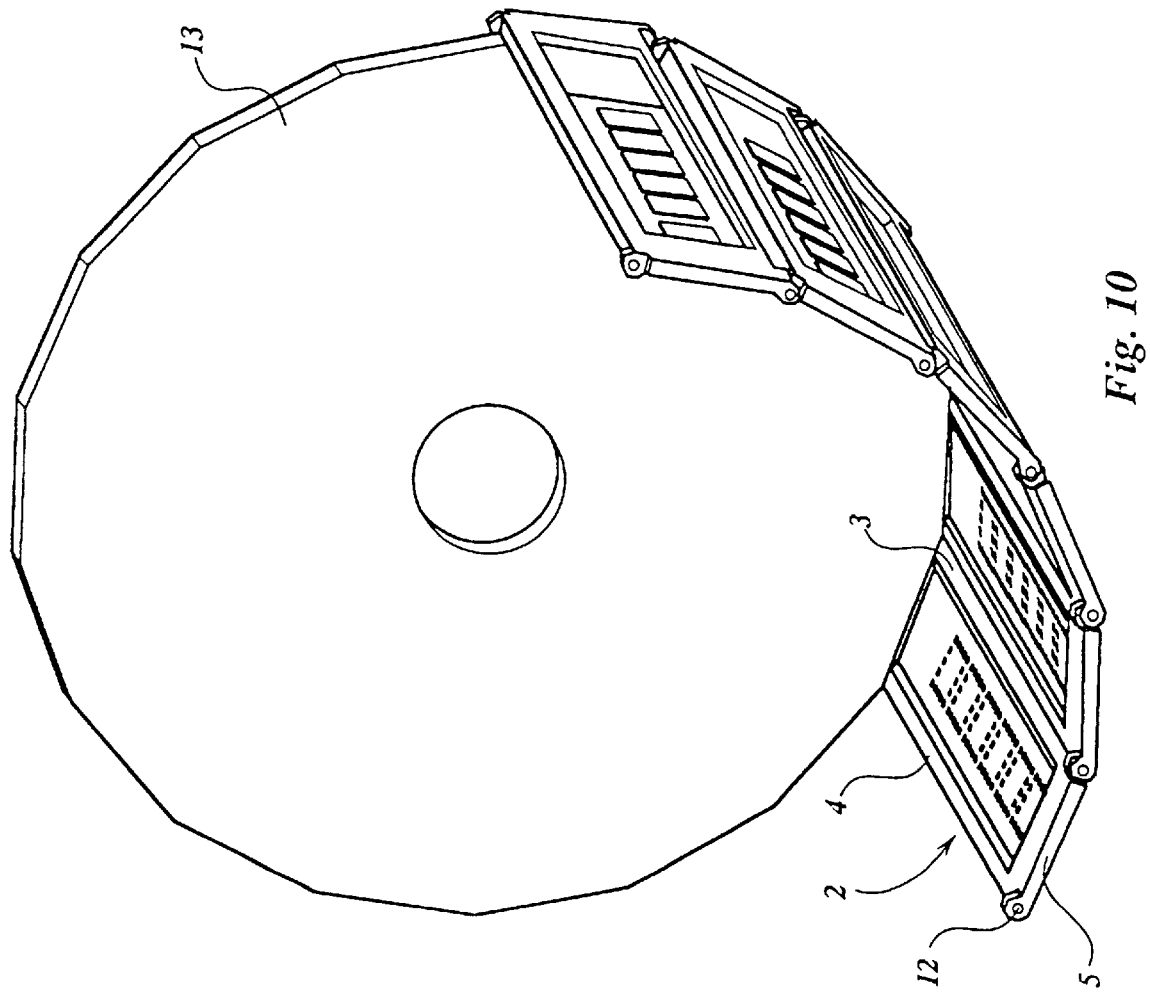

FIG. 10 diagrammatically shows a part of the conveying element built up of links, which comprises a pulley element for the conveying element.

Figure 11:
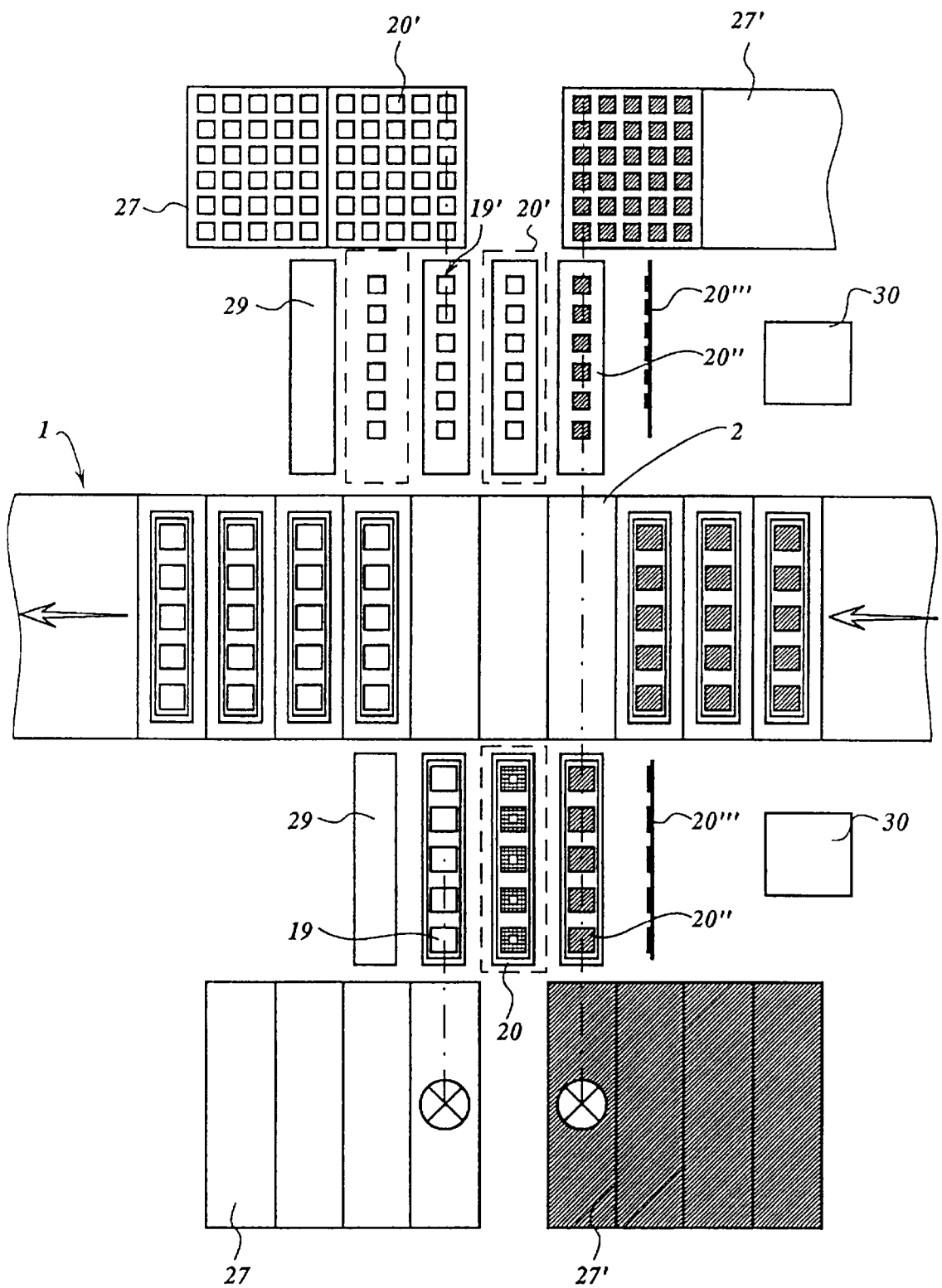
Figure 12:
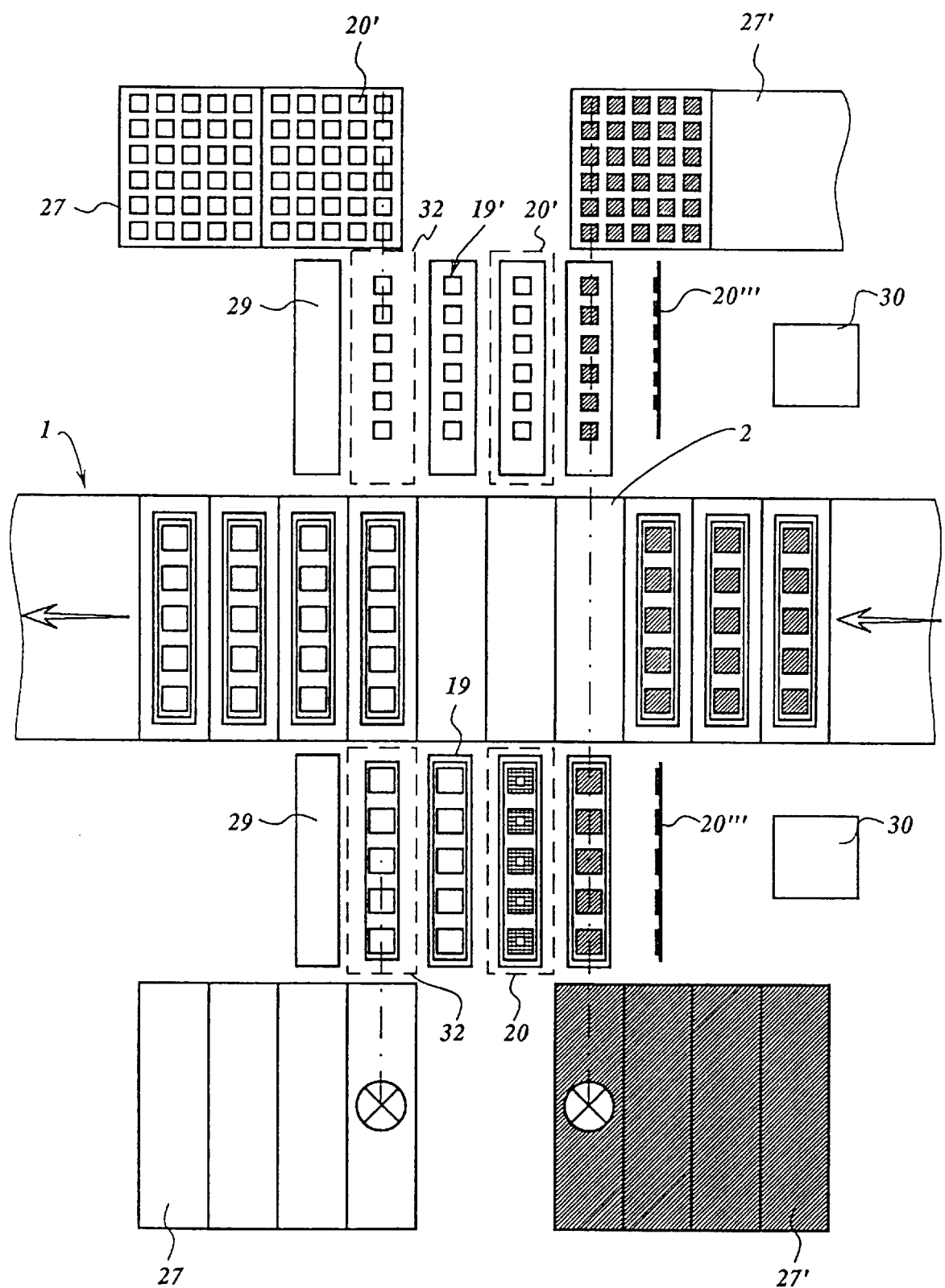

FIGS. 11 and 12 are diagrammatic plan views of an upper part of the conveying element, showing means for placing plate-shaped elements and substrates on the conveying element and removing them therefrom, which means are disposed near said upper part.

Figure 13:
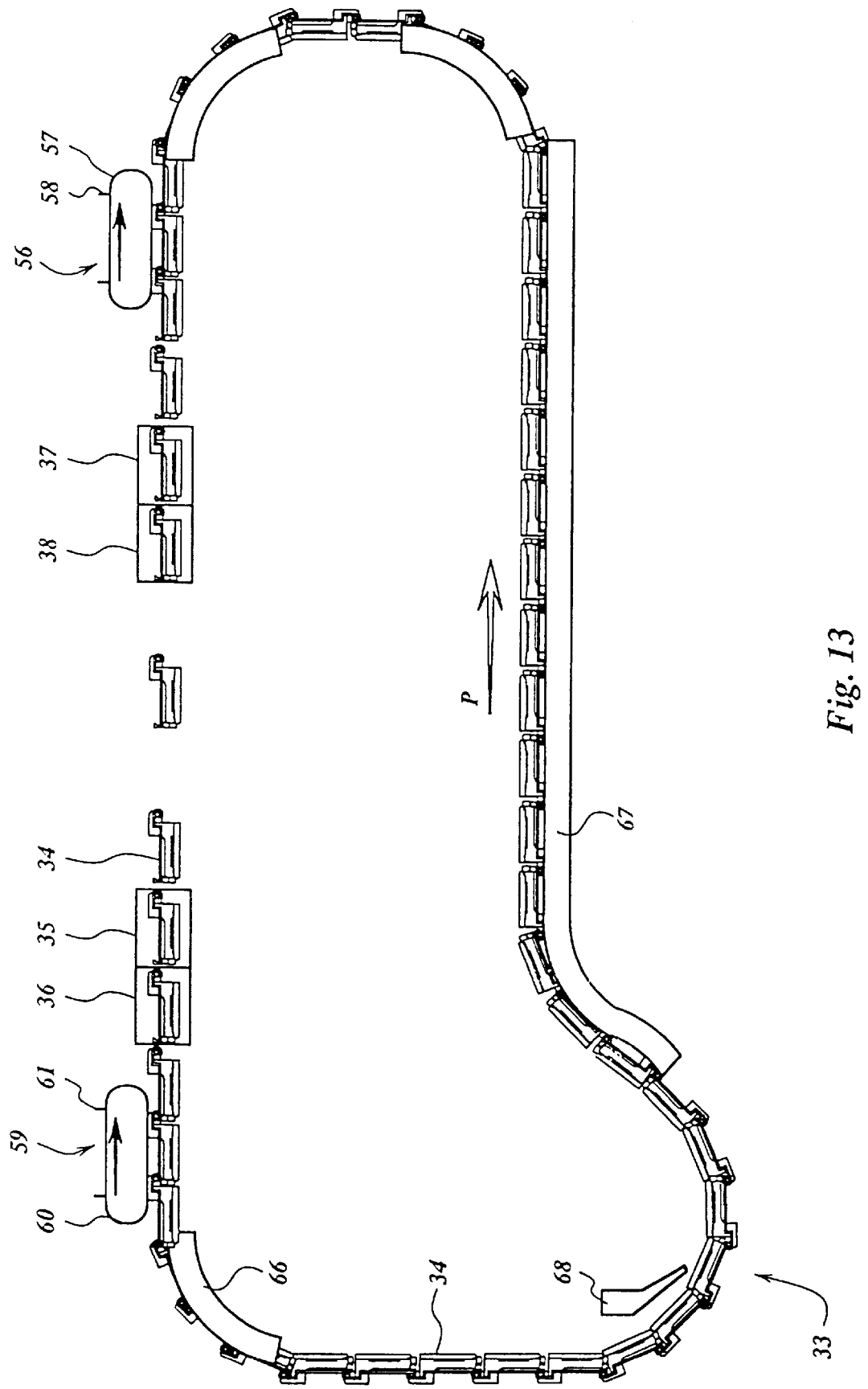

FIG. 13 is a diagrammatic side view of another embodiment of a device according to the invention.

Figure 14:
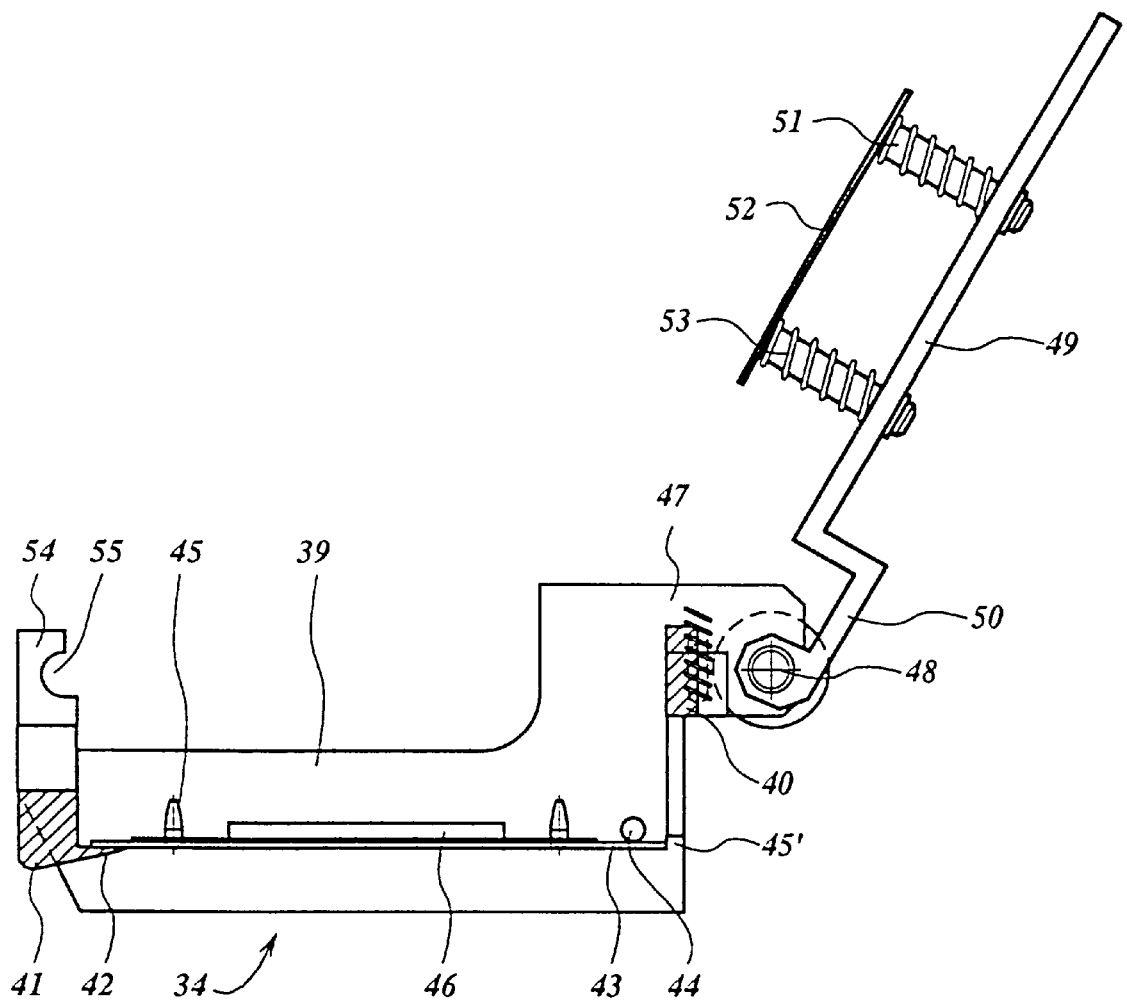

FIG. 14 shows a link of a conveying element used with the device shown in FIG. 13, in a position thereof which is suitable for introducing and/or removing a plate-shaped element and one or more substrates.

Figure 15:
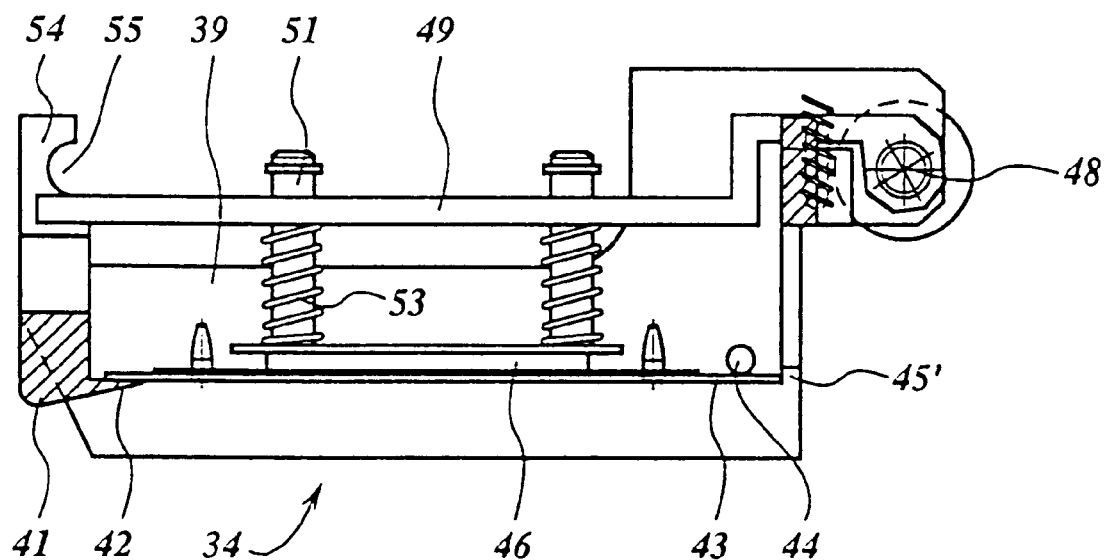

FIG. 15 is a sectional view corresponding with FIG. 14 of a link, in a position in which a plate-shaped element and one or more substrates are clamped down in said link.

Figure 16:
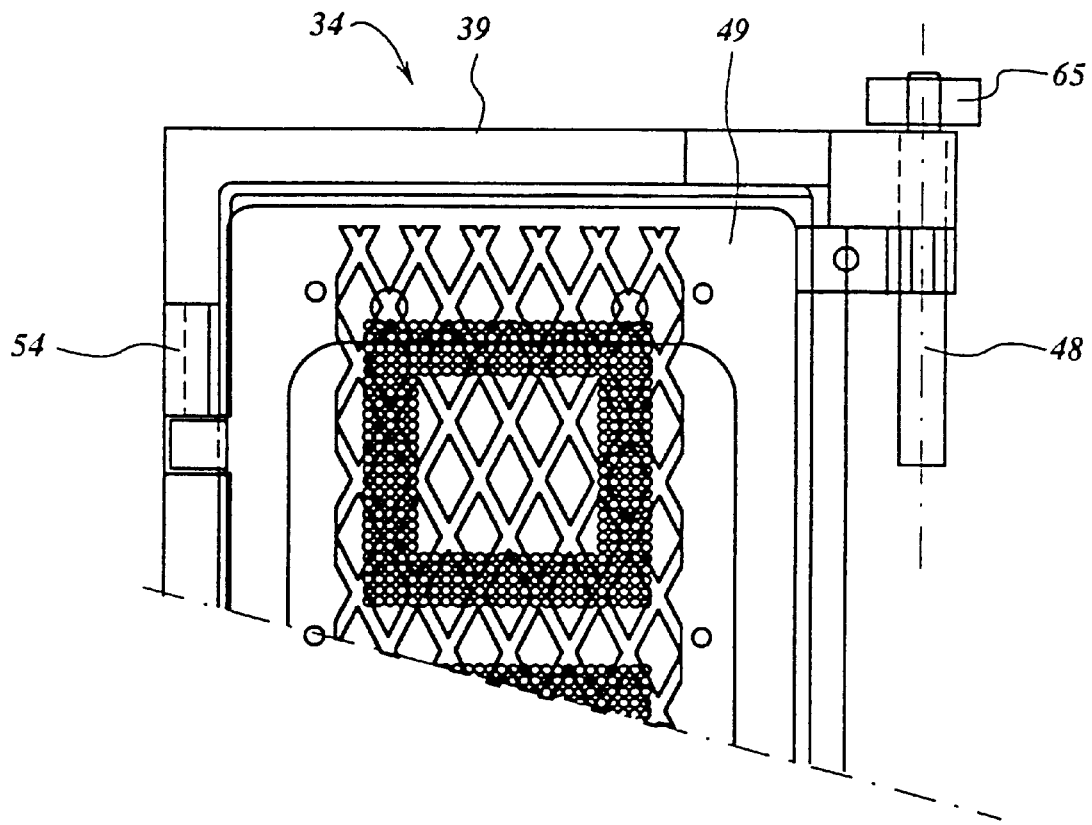

FIG. 16 is a plan view of a part of the link shown in FIG. 15.

Figure 17:
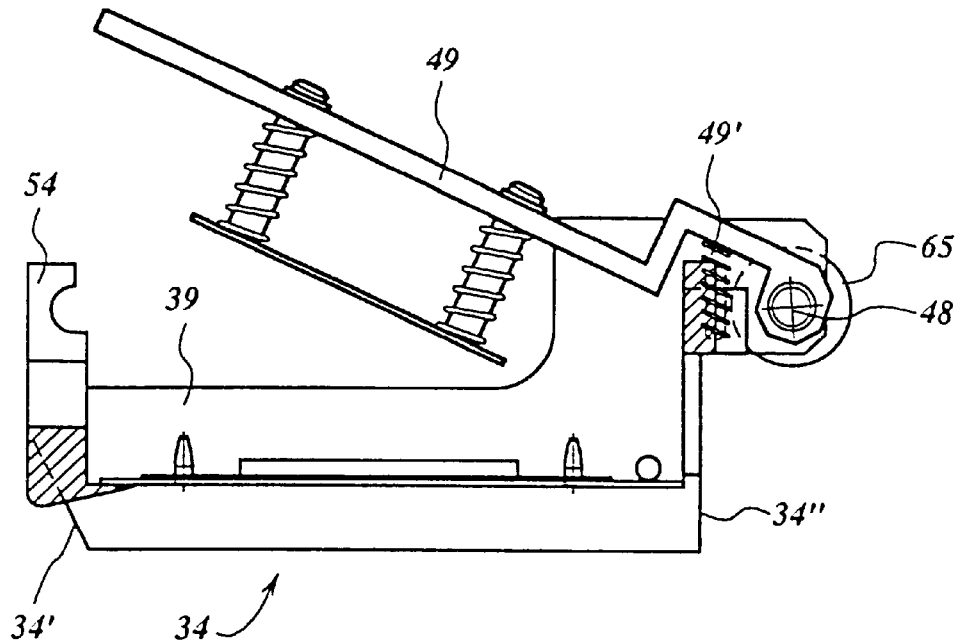

FIG. 17 is a sectional view corresponding with FIG. 14, which shows the cover of the link in partially open condition.

Figure 18:
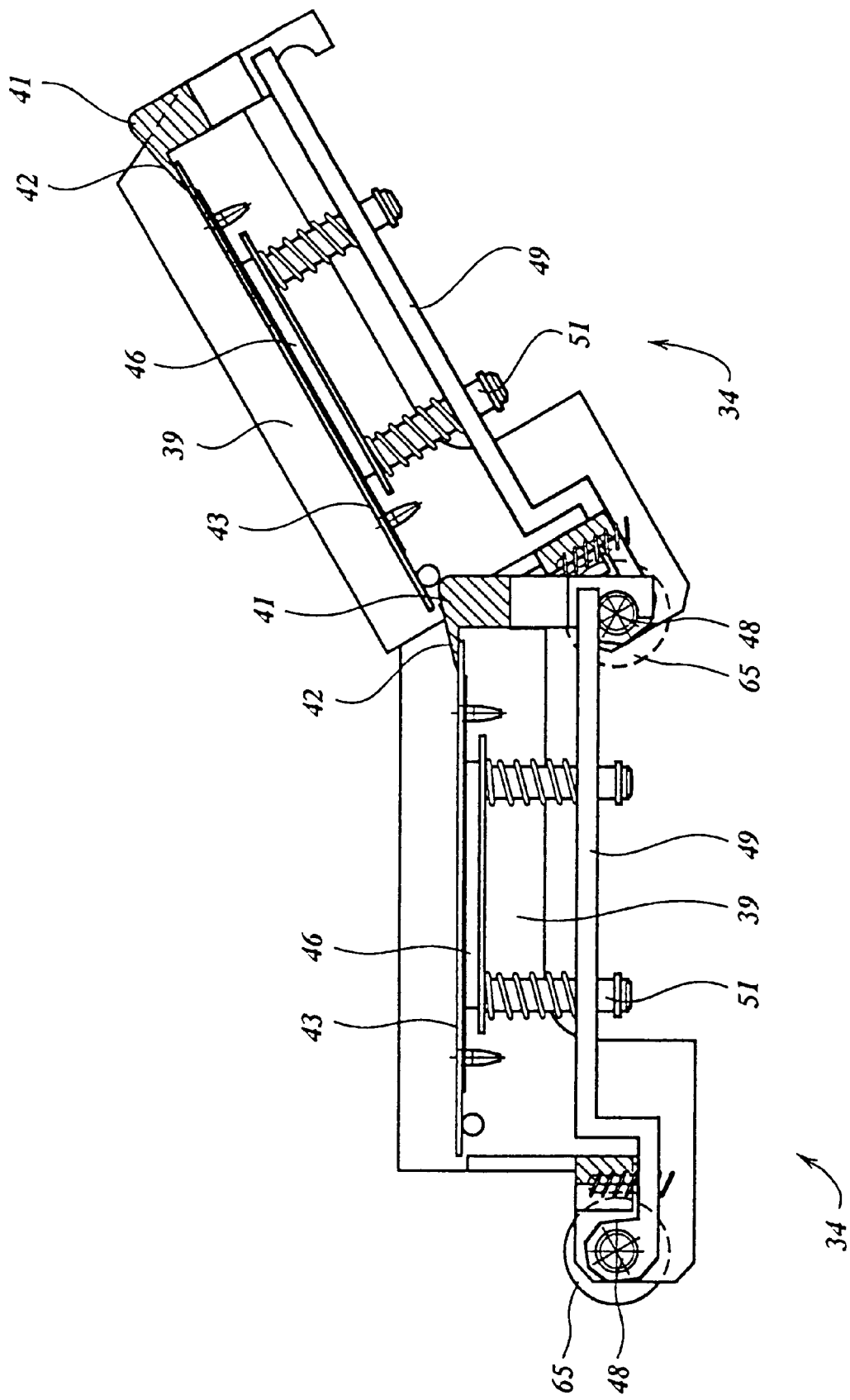

FIG. 18 shows two pivotally connected links, in a position which said links occupy when traversing part of the lower path along which the conveyor moves during operation.

Figure 19:
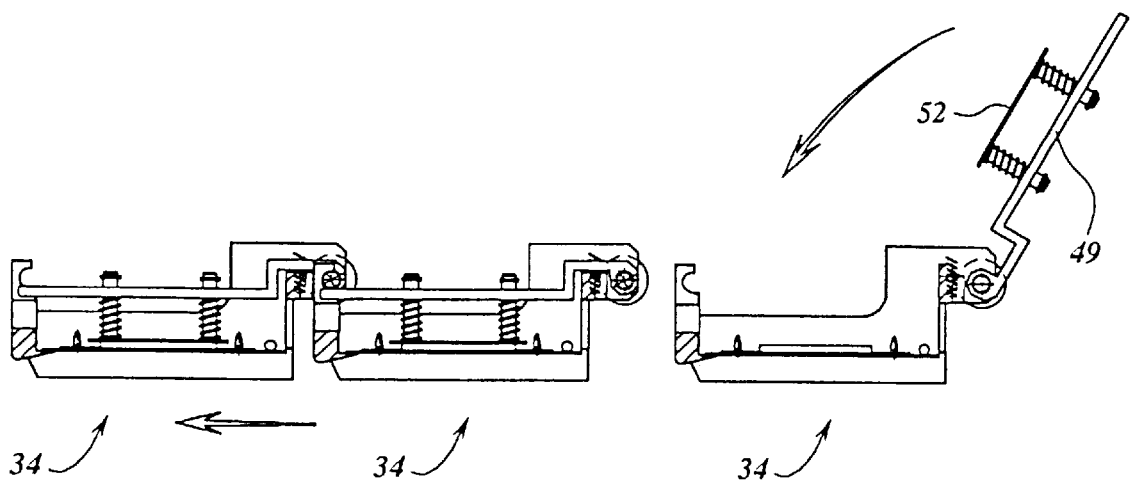
Figure 20:
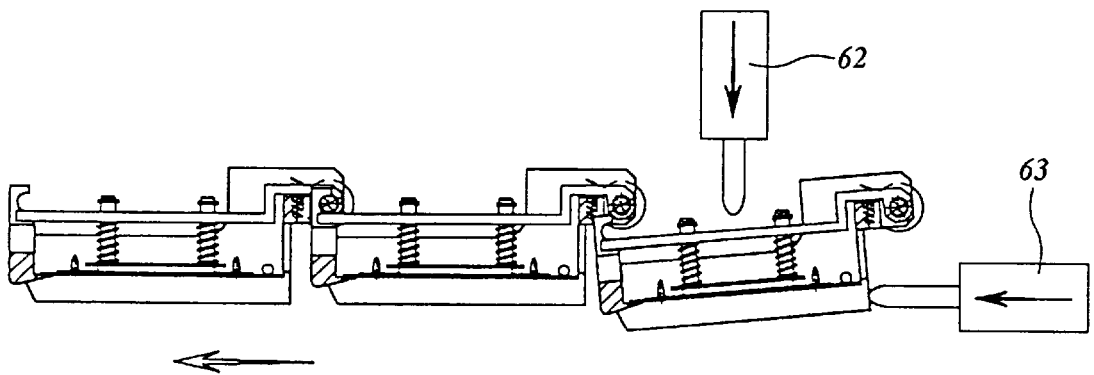
Figure 21:
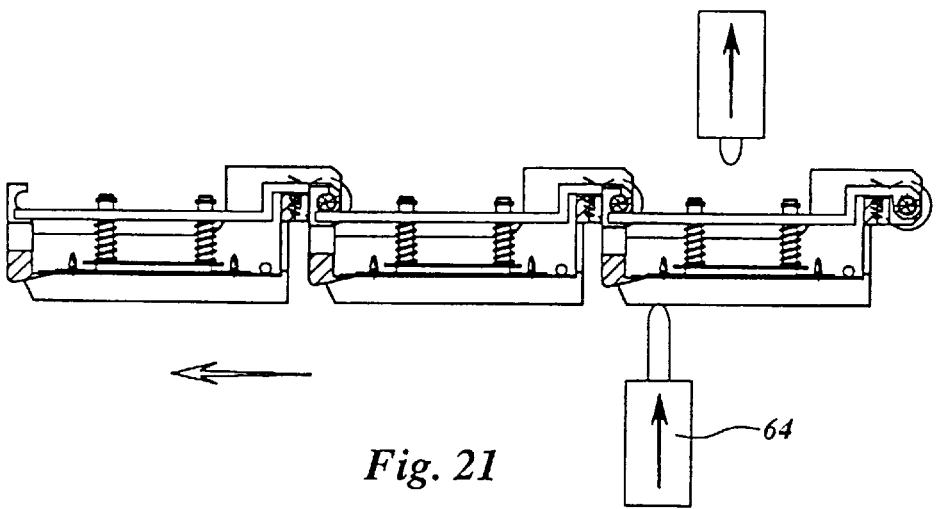

FIGS. 19–21 show successive phases of the linking together of successive links.

Figure 22:
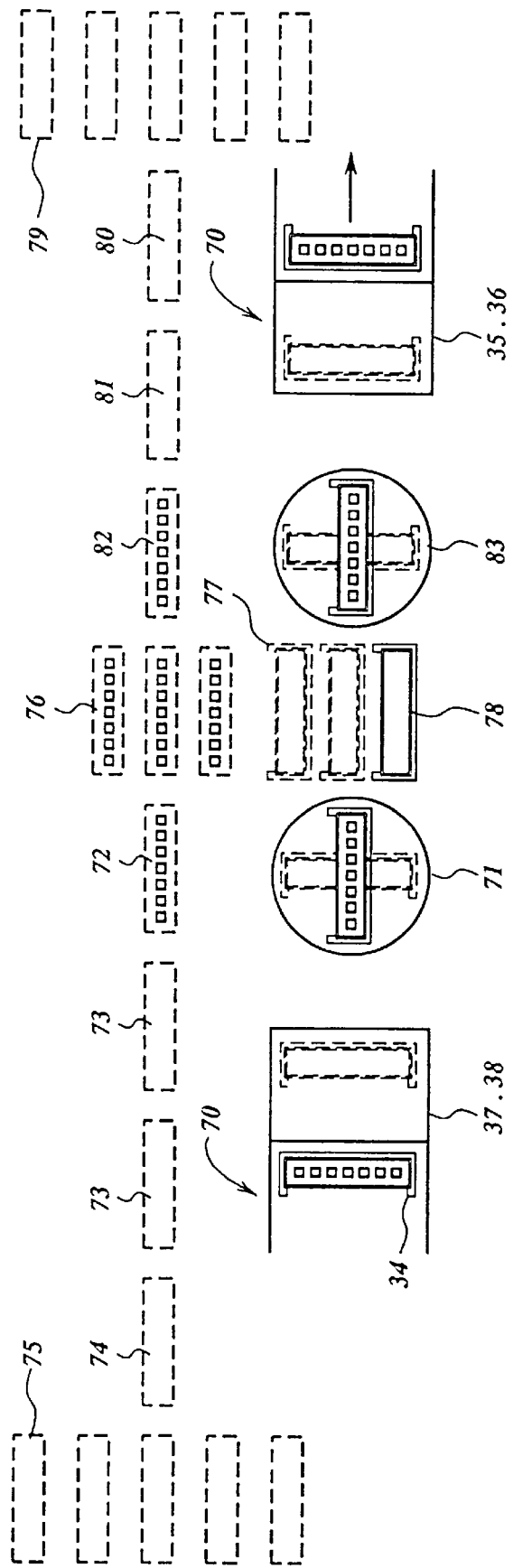

FIG. 22 diagrammatically shows means to be used in introducing and/or removing plate-shaped elements and/or substrates.

Figure 1:
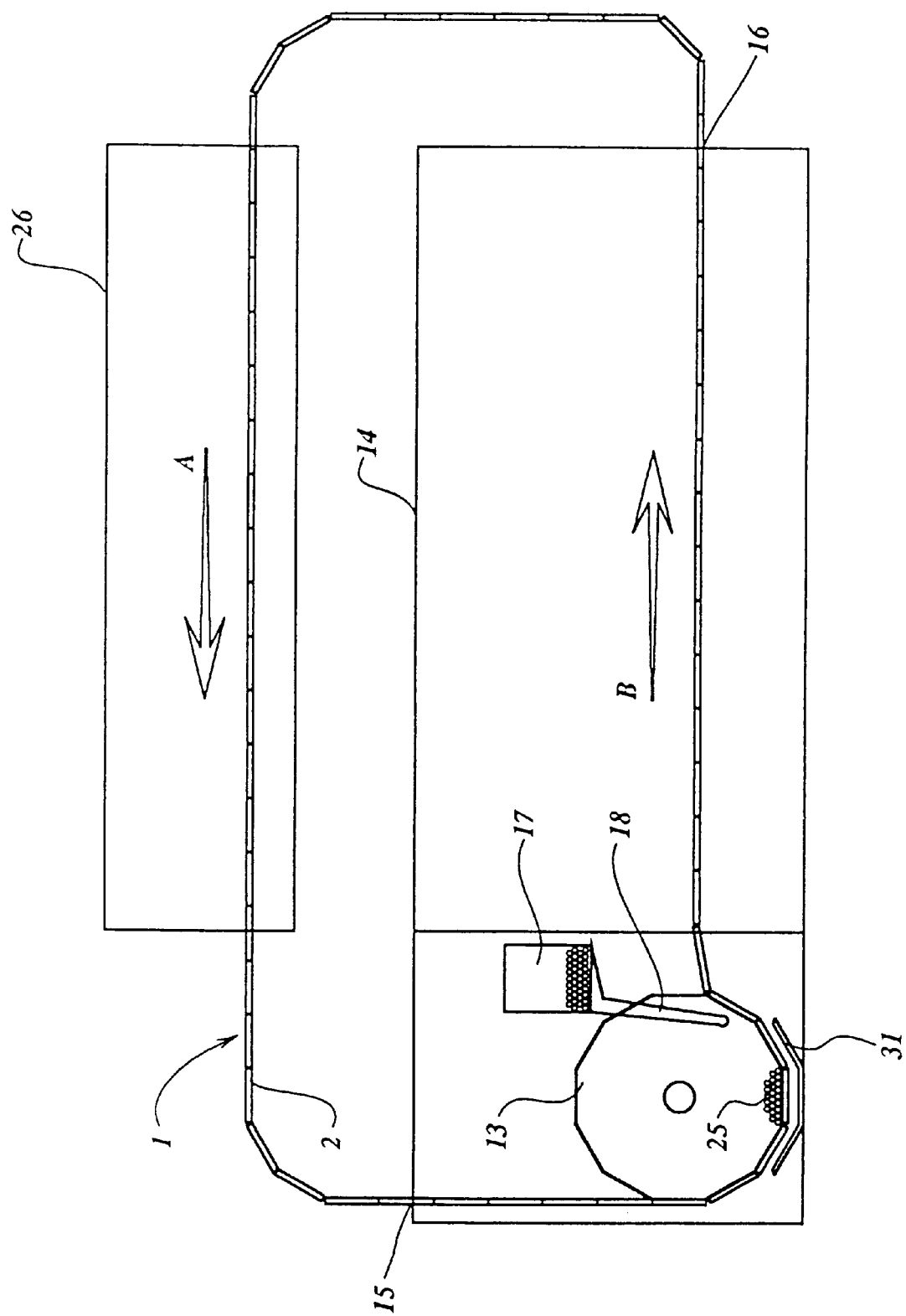
FIG. 1 is a diagrammatic side view of a device according to the invention.
Figure 2:
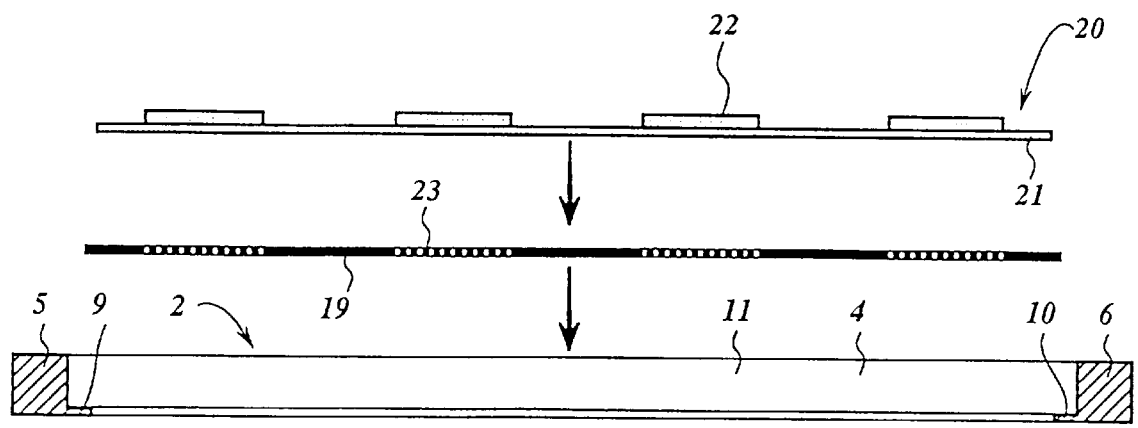
FIG. 2 is a longitudinal sectional view of a link of the conveying element, which shows an apertured plate-shaped element and a substrate positioned some distance above said conveying element.
Figure 4:
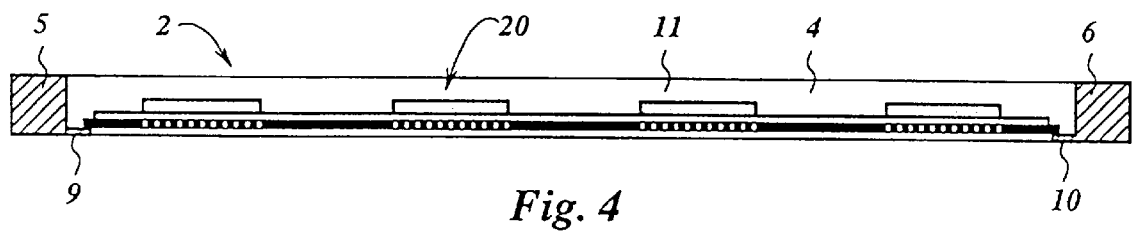
FIG. 4 is a longitudinal sectional view corresponding with FIG. 2, which shows the plate-shaped element and the substrate positioned in a recess which is present in said link.
Figure 6:
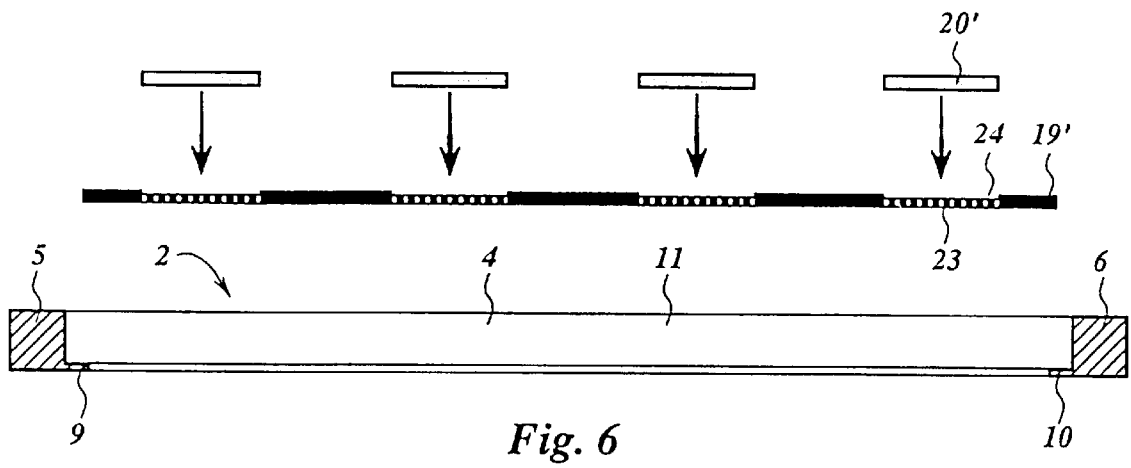
FIG. 6 is a longitudinal sectional view corresponding with FIG. 2, which shows a single plate-shaped element, however, in combination with a few separate substrates.
Figure 8:
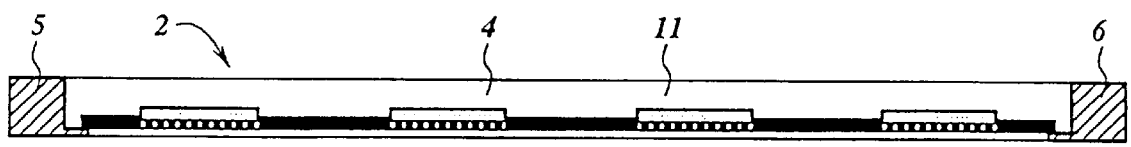
FIG. 8 is a longitudinal sectional view corresponding with FIG. 6, which shows the plate-shaped element and the substrates positioned in the recess which is present in said link.

The device shown in FIG. 1 comprises a conveying element 1, which is built up of a plurality of pivotally connected links 2. As will be apparent from FIG. 1, conveying element 1 is thereby guided in such a manner that an upper part of the conveying element will be moved along an upper, at least substantially horizontal path in the direction indicated by arrow A during operation, whilst a lower part of the conveying element will be moved along a lower path in an at least substantially horizontal direction indicated by arrow B during operation. Of course conveying element 1 will be passed over guide members (not shown), in a manner known per se, near the left-hand and the right-hand end of the upper part, seen in FIG. 1, and near the right-hand end of the lower part.

As is shown in more detail in FIGS. 3–9, each link 2 comprises two beams 3 and 4 extending perpendicularly to the longitudinal direction of the conveying element, with the ends of said beams 3 and 4 being coupled by means of beams 5 and 6 extending parallel to the longitudinal direction of the conveying element, all this in such a manner that each link has a substantially rectangular or square shape.

As is shown in the Figures, beams 3–6 are provided with projecting flanges 7–10 at their bottom ends, which flanges form a circumferential supporting edge on the bottom side of the recess 11 bounded by said beams, which supporting edge serves a purpose yet to be described in more detail hereafter.

Figure 3:
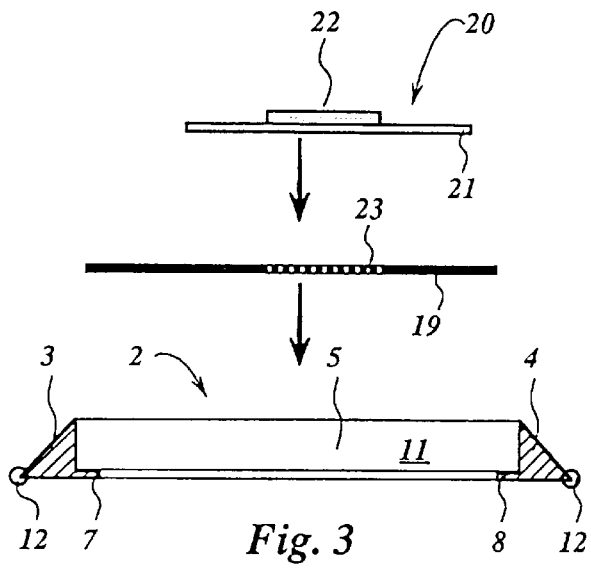
FIG. 3 is a cross-sectional view of a link corresponding with FIG. 2.
Figure 5:
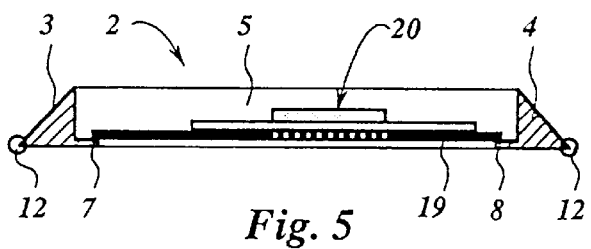
FIG. 5 is a cross-sectional view of FIG. 4.
Figure 7:
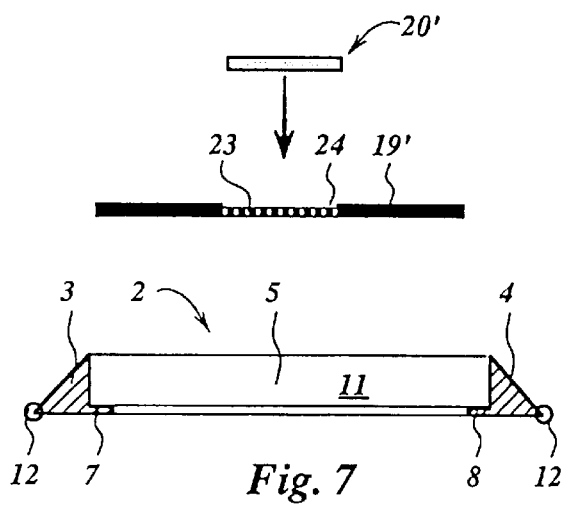
FIG. 7 is a cross-sectional view of a link corresponding with FIG. 6.
Figure 9:
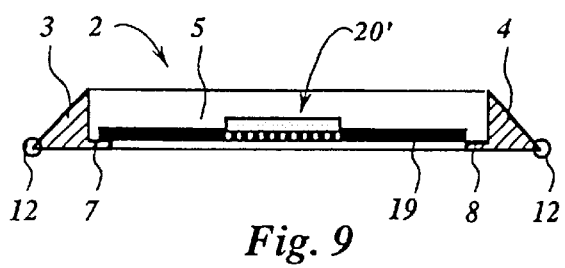
FIG. 9 is a cross-sectional view of FIG. 8.

As is furthermore apparent, for example from FIG. 3, the lower boundary surfaces of the flanges 7 and 8 contiguous to beams 3 and 4 slope upwards in the direction of the free ends of said flanges 7 and 8, so that said flanges 7 and 8 terminate in a point.

From said figures it is furthermore apparent that beams 3 and 4 have a substantially triangular section. Near their outside corner points beams 3 and 4 are pivotally connected, by means of pivot axes 12 (only diagrammatically indicated), to corresponding beams 3 and 4 of adjacent links. All this is also diagrammatically shown in FIG. 10. From FIG. 1 and said FIG. 10 it can furthermore be derived that a part extending in downward direction from the left-hand end of the horizontally extending upper part of conveying element 1 is passed over two spaced-apart pulleys 13 so as to effect a transition to the lower horizontally extending part of the conveying element, whereby the conveying element is guided in such a manner that it extends along lower parts of the pulleys 13, which are positioned lower than the lower horizontally extending part of conveying element 1.

As will be apparent from FIGS. 1 and 10, pulleys 13 have an angular circumference, so that each link 2 can be supported with its ends formed by beams 5 and 6 on straight circumferential sides of the two spaced-apart pulleys 13.

As is furthermore diagrammatically shown in FIG. 1, pulleys 13, the part of the conveying element that is passed over said pulleys as well as the lower part of the conveyor are disposed in a housing 14. Conveying element 1 is thereby guided into and out of housing 14 via the lock mechanisms (not shown) disposed at positions 15 and 16, which lock mechanisms shut off the interior of housing 14 from the atmosphere, so that a desired atmosphere, for example a nonoxidizing atmosphere, can be maintained in the interior of housing 14.

At least the part of housing 14, through which the horizontally extending lower part of the chain extends, is provided with means by which the parts moving through the housing can be subjected to a heat treatment, so that said part forms an oven, as it were, for example of the type as described and illustrated in the aforesaid U.S. Pat. No. 4,951,401 or in the aforesaid European patents Nos. 0 461 961 and 0 471 619.

Furthermore a storage container 17 for solder balls is disposed in the left-hand part of housing 14 which accommodates the pulleys 13. Said storage container is in communication, via a discharge channel 18, with the space which is present between the two spaced-apart pulleys 13.

As is diagrammatically shown in FIGS. 2–5, a plate-shaped element 19 can be placed into a recess 11 provided in a link 2, on a circumferential edge formed by flanges 7–10. A substrate 20, for example a so-called leadframe or a so-called interposer, which may be built up of a carrier 21 comprising a number of integrated circuits 22 provided thereon, for example as described in the aforesaid U.S. Pat. No. 5,442,852, may be placed on said plate-shaped element. Carrier 21 will thereby be provided on its side facing plate-shaped element 19 with a large number of connecting points (not shown), which are arranged in a predetermined pattern.

Plate-shaped element 19 is provided with a plurality of holes 23, which are arranged in a pattern which corresponds with the pattern of the connecting points on substrate 20.

Plate-shaped element 19 and substrate 20 can thereby be placed and fixed in recess 11 with the aid of suitable aligning and fixing means (not shown), in such a manner that the holes 23 provided in plate-shaped element 19 are in line with the connecting points on the surface of substrate 20 that butts against plate-shaped element 19.

As is shown in FIGS. 6–9, it is also possible to use a plate-shaped element 19' in combination with several separate substrates 20', to which purpose recesses 24 for receiving respective substrates 20' are preferably provided in the side of plate-shaped element 19' that faces substrates 20'.

In the upper part of the conveying element or the upper path followed by the conveying element, the substrate(s) thus lie on top of the apertured plate-shaped element, with their surface provided with connecting points facing downwards. It will be apparent that when links 2 are passed over the reversing element made up of the spaced-apart pulleys 13, the links 2 and the plate-shaped elements 19, 19' and the substrates 20, 20' accommodated therein will be gradually turned 180°, so that the plate-shaped elements will be positioned on top of the substrates in the lower part of the conveying element that moves through housing 14 or the lower path followed by the conveying element through housing 14.

During operation solder balls 25 are gradually supplied from hopper 17, by means of a suitable metering element or the like, to the space present between plate-shaped pulleys 13, so that a thin layer of solder balls 25 will be present at least on the links 2 or the plate-shaped elements 19, 19' present near the bottom side of pulleys 13. It will be apparent that part of said solder balls will enter the holes in the plate-shaped element 19 that lies on top of the substrate(s) in this position. During the further movement of the links 2 supporting the plate-shaped elements, into each hole of which a solder ball has thus been placed, excess solder balls can roll back onto the next link in a direction opposed to the direction of movement of the links in question. Excess solder balls are prevented from remaining behind on a plate-shaped element because the flanges 7 and 8, on which the plate-shaped element is supported, are bevelled in the above-described manner. Furthermore the pivotal connection between the successive links is configured such that solder balls cannot escape through gaps or the like which are present between successive links. Plate-shaped pulleys 13 prevent the solder balls from escaping in lateral direction.

Advantageously, a device (not shown in the figures) for removing an oxide film present on the outer surface of the solder balls is disposed between the storage space 17 and the channel 18 through which the solder balls are supplied to the space present between the plate-shaped pulleys 13. The solder balls that are placed on the substrate will thus be clear of an oxide film, which reduces or eliminates the need to use a soldering flux.

Then the substrates, the plate-shaped elements 19 present thereon and the solder balls accommodated in the holes of said plate-shaped elements are moved along through housing 14, in which melting of the solder balls with a view to bonding said solder balls to the connecting points on substrates 20, and subsequent cooling of the aggregate can take place. Subsequently the plate-shaped elements, the substrates and the solder balls bonded thereto are moved along until they arrive at the upper part or the upper path of the conveying element, where they can be removed from the conveying element.

As is diagrammatically shown in FIG. 1, the placing and removing of the plate-shaped elements and the substrates on and from the conveying element may take place at station 26, possible parts of which are shown in FIGS. 11 and 12.

Strip-shaped substrates 20 or separate substrates 20' may be supplied in cassettes 27. When the device is started, closed plates 29 will first be placed into the recesses 11 of one or more successive links, so that a desired number of solder balls can be introduced into the space between the pulleys when said links provided with closed plates move over pulleys 13, before a link carrying a combination of a substrate and an apertured element is moved past pulleys 13.

Plate-shaped elements 19, 19' disposed beside the conveying element can be placed into the links behind those links that are provided with closed plates, by means of a robot (not shown) or the like.

Also substrates 20, 20' can be removed from the cassettes and be placed on the plate-shaped elements by means of a robot (not shown) or the like. Although such means for placing plate-shaped elements and/or substrates are shown to be present on either side of the conveyor belt in FIG. 11, it will be apparent that an arrangement wherein such means are for example only provided on one side of the conveying element is also possible.

It is possible thereby to place a plate-shaped element into a link first, and then place one or more substrates on the plate-shaped element, or first place one or more substrates on the plate-shaped element, and then place the combination of a plate-shaped element and one or more substrates thus obtained into the link.

The substrates which have been carried back from housing 14 to station 26 may be removed here, as is shown for a substrate 20", possibly turned to position 20''', and be inspected thereby by means of an inspection device 30. Products which exhibit faults may for example be discharged for final processing or the like, whilst approved products may be reintroduced into the previously emptied cassettes 27, which have been moved to positions 27'.

If desired, it is possible to exchange the apertured plate-shaped elements 19, 19' for other plate-shaped elements 19, 19' in station 26 during operation, or to leave the plate-shaped elements in the links and place new substrates on the plate-shaped elements that remain behind.

When the device is stopped, an apertured plate present in a link may be exchanged for a plate in which a large passage has been formed. The apertured plates from next links may be removed from the links, if desired.

When the link which supports the plate comprising the large passage is moved past the pulleys 13, the solder balls 25 still present in the space between pulleys 13 can fall through said passage into a receptacle 31 and be returned to storage container 17.

The embodiment of station 26 that is shown in FIG. 1 substantially corresponds with the embodiment of FIG. 11, and corresponding parts are indicated by the same numerals in FIGS. 11 and 12.

As is shown in FIG. 12, an element 32 for applying a flux to the connecting points on the substrate, in a manner known per se, may furthermore be provided at this location.

Of course additions and/or modifications to the above-described embodiment of the device according to the invention are conceivable within the spirit and scope of the invention.

Thus the plate-shaped elements might be fixedly connected to the links or be integral with the links if only one type of substrate is processed.

Furthermore other means for placing solder balls into the holes in the plate-shaped elements might be used, for example means of the type as described in the aforesaid U.S. Pat. No. 5,431,332.

The device which is diagrammatically shown in FIG. 13 comprises a conveying element 33 which is built up of a plurality of links 34.

The links 34 of conveying element 33 are introduced, via a lock mechanism (diagrammatically shown in FIG. 13), which is provided with lock chambers 35 and 36 disposed one behind the other in the illustrated embodiment, into an inlet end of a housing (not shown) which encloses the conveying element along a large part of its length, and the links 34 of conveying element 33 are carried out of the housing again near the outlet end of said housing, via a lock mechanism which consists of two contiguous lock chambers 37 and 38 in the illustrated embodiment. Also this housing will be provided with suitable means for subjecting the elements moving through the housing during operation to a heat treatment.

As is furthermore diagrammatically shown in FIG. 13, the links 34, which are pivotally coupled during their movement through the aforesaid housing, are uncoupled entering lock chamber 37, and after they have exited lock chamber 36, that is, after they have reentered the housing, they will be coupled again. Said coupling and uncoupling will be explained in more detail hereafter with reference to FIGS. 19–21.

As is apparent in particular from FIGS. 14–17, a link comprises two side walls 39 extending parallel to the longitudinal direction of conveying element 33, which side walls are interconnected by connecting beams 40 and 41 extending transversely to the longitudinal direction of conveying element 33.

Beam 41 is provided with a projecting nose 42, which, together with projecting edges of side walls 39, functions to support a plate-shaped element 43 corresponding with the above-described plate-shaped element 19. The plate-shaped element is only supported thereby at its edge supported by nose 42, whilst the edge of plate-shaped element 43 that faces away from nose 42 in FIG. 14 is not supported on its bottom side. As is shown in FIGS. 14 and 15, the plate-shaped element is stiffened at said end by means of a supporting member 44. Furthermore the ends of said unsupported edge of plate-shaped element 43 abut against cams 45' formed on side walls 39. Plate-shaped element 43 may furthermore be provided with projecting pins 45 for correctly positioning a substrate or substrates 46 to be placed on plate-shaped element 43, in a similar manner as described above with reference to the first embodiment.

Projecting ears 47 are attached to side walls 39 near the ends of connecting beam 40. A cover 49 is pivotally connected to link 34 by means of pins 48 fitted in said ears. Cover 49 is to that end provided with two arms 50 which can pivot about pins 48.

Four holes are provided in the cover in the corner points of a quadrangle, in which holes pins 51 are slidably accommodated. A pressure plate 52 is attached to said pins, whilst compression springs 53 surrounding pins 51 are provided between the facing surfaces of cover 49 and pressure plate 52.

Upwardly extending columns 54 are attached to the ends of connecting beam 41. Recesses 55 being shaped to receive pins 48 are formed in the sides of columns 54 that are turned towards pins 48.

The pivotally interconnected links 34 of conveying element 33 are moved in the direction indicated by arrow P by means of a driving element 56 disposed inside the housing that surrounds conveying element 33, which driving element is disposed near the end of the housing surrounding conveying element 33. Driving element 55 for example comprises a short, endless belt 57 to be driven, which is disposed inside the housing, and which is provided with carriers 58, which engage behind the successive links so as to move the links in the direction indicated by arrow P.

A similar driving element 59 is disposed near the inlet of the housing that surrounds the conveying element 33, which driving element likewise comprises an endless belt 60 and elements 61 connected thereto, which engage between successive links.

The two driving elements 56 and 59 are coupled, so that the velocity of movement of the pivotally interconnected links at the inlet end of the housing will be the same as the velocity of movement of the interconnected links at the outlet end of the housing.

As already noted above, the links 34 of conveying element 33 which are being moved from lock 38 to lock 35, have been disconnected from each other. After a link has been disconnected, the cover 49 of the link 34 in question is automatically pivoted into the position shown in FIG. 17, by means of a spring 49' provided between the link and the cover. The separate links can then be moved intermittently, by drive means not shown, and after cover 49 has been pivoted into the position illustrated in FIG. 14 by means not shown, substrate(s) 46 and plate-shaped element(s) 43 can be placed into the link or be removed from said link, as the case may be, whilst the link in question is stationary.

After the placing of the substrate(s) to be provided with solder balls, cover 49 will be pivoted, by setting means not shown, into a position in which pressure plate 52 is in contact with the substrate. Then the link in question is slid into first lock chamber 35 by driving means not shown. Then lock chamber 35 is closed, air is removed from lock chamber 35 and nitrogen or the like are introduced into the lock chamber. Then the passage between the two lock chambers 35 and 36, in each of which the same pressure prevails at that moment, whilst they are both filled with nitrogen or a similar inert gas, is opened, after which the link can be slid from lock chamber 35 into lock chamber 36. After the communication between lock chambers 35 and 36 has been shut off, an open communication may be effected between lock chamber 36 and the housing, which surrounds conveying element 33 between lock chamber 36 and lock chamber 37, in order to introduce the link into said housing in this manner. Then the link which has been introduced into the housing in this manner is coupled to the preceding link.

Said coupling of successive links is diagrammatically shown in FIGS. 19–21. As is shown in FIG. 19, a desired plate-shaped element and (a) desired substrate(s) can be introduced into the link in the open position of cover 49, after which the cover can be pivoted. Then, after the link has been introduced into the housing that surrounds the conveying element, an anticlockwise (seen in FIG. 20) tilting of the links about an imaginary tilting axis extending transversely to the longitudinal direction of the conveying element is effected by means of suitable setting elements 62 and 63, and by means of suitable guide means (not shown), whilst the springs 53 are compressed during the clamping down of substrate(s) 46 on plate-shaped element 43 by means of pressure plate 52, and simultaneously a movement in the direction of the preceding link is effected, so that the upper ends of columns 54 move under the pins 48 of the preceding link. Then the link is pivoted back again by means of a driving element 64, as is diagrammatically indicated in FIG. 21, so that the recesses 55 in the upright columns 54 of the links thus pivoted will be positioned before the pins 48 of the preceding link seen in the direction of movement of the conveying element, and said pins will be placed into the recesses 55 of columns 54 as a result of the forward movement of the interconnected links, as a result of which the links thus supplied into the housing via lock 36 will be coupled with the other links of the conveying element. Springs 53 thereby push the end of the cover against the bottom sides of the pins 48 of the preceding link.

In order to uncouple the links with a view to passing the uncoupled links through lock 37, a link is moved in a manner opposed to the above-described manner so as to uncouple the columns 54 of a preceding link from the pins 48 of the next link.

Instead of tilting the links for said coupling and uncoupling, it is for example also possible to effect said coupling and uncoupling by moving the links horizontally and vertically with respect to each other.

As is furthermore shown in FIG. 16, wheels or rollers 65 are provided on the ends of the pins 48 that project beyond the link.

Said rollers function to guide conveying element 33 through the housing that surrounds conveying element 33. As will be apparent from FIG. 13, the links 34 are carried into the housing in horizontal direction near lock 36, and subsequently they are guided vertically downwards through the housing, with guide members 66, which cooperate with rollers 65, being provided for diverting the links from the upper horizontal path, along which the links 34 are being moved, to the vertical path.

The lower path along which the interconnected links 34 of conveying element 33 are moved comprises a curvilinear path portion contiguous to the vertically extending path portion, which subsequently merges into a lower path, which extends in horizontal direction again. Further guide members 67 cooperating with rollers 65 are disposed near the transition between the curvilinear path and the lower horizontal path and along said horizontal path. The links are freely suspended and unsupported along a large part of the curvilinear path. Links 34 are provided with mating stop surfaces 34' and 34". (FIG. 17), however. The stop surfaces or stops 34' and 34", of successive links abut against each other in the position of the links which is shown in FIG. 18, thus preventing the unsupported links from further pivoting with respect to each other and thereby reducing (seen in FIG. 18) the obtuse angle between the upper surfaces of the plate-shaped elements 43 supported by the links in question.

It will be apparent that in this embodiment of the device according to the invention, and also in the first embodiment described above, the substrates are placed on top of the plate-shaped elements while the links are moving along an upper horizontal path in an upper part of the conveying element, after which the links are moved in such a manner that the plate-shaped elements will be positioned on top of the substrates during their movement along the curvilinear path and the lower horizontal path. Also in this embodiment a metering element 68 for supplying solder balls is disposed near the curvilinear path, which metering element can be fed with solder balls again while using a device which removes an oxide film present on the solder balls before said solder balls are deposited on the plate-shaped elements being supported on the substrates. Another possibility is to deoxidize the solder balls by chemical or electrochemical means, in a manner which is known per se, prior to placing the solder balls on the substrates. As already noted before, the removal of the oxide film or the deoxidizing of the solder balls reduces the need to use a flux for soldering significantly, and in many cases eliminates said need altogether.

From FIG. 18, which shows two links 34 in a position which said links will occupy when following the curvilinear path, it will be apparent that the solder balls will be confined thereby between the parts of the side walls 39 that project above the plate-shaped element in this position, so that no further measures need to be taken to prevent the solder balls that have been deposited on the plate-shaped elements from rolling off the links in lateral direction. From FIG. 18 it is furthermore apparent that the construction is such, that during the movement along the curvilinear path, the end of a plate-shaped element 43 supported by a link overlaps the connecting beam of the next link 34, seen in the direction of movement of conveying element 33. As a result of that, solder balls which are present on the plate-shaped elements 43 supported by the links which are moving upwards along the curvilinear path can roll onto the plate-shaped element of the successive links without falling through the gap between successive links.

This undisturbed rolling movement of the solder balls is partially supported by the fact that the projecting nose 42 of connecting beam 41, which extends above the plate-shaped element in this position of the links, terminates in a point.

Preferably the links are guided along at least part of the rising part of the curvilinear path along which the links are moved in such a manner that the angle of inclination of the plate-shaped element is preferably approximately equal to or smaller than the natural depositing angle of the solder balls, that is, the slope which will be obtained when a heap of solder balls is freely deposited. This is made possible here in that the links which are freely suspended in the curved path portion can only pivot to a limited extent with respect to each other, as explained above. If a plate-shaped element is moved at a relatively low speed and preferably at such an angle, it can be observed that a few layers of balls will form on the respective plate-shaped element, one layer lying on top of the other, which eventually will gradually roll off the plate-shaped element upon further forward movement of the plate-shaped element. In this manner a highly effective filling of all openings in the plate-shaped element with solder balls is ensured.

During the further movement of substrates and plate-shaped elements present thereon, whose openings have been filled with solder balls, gradual heating of the various elements for melting the solder balls and subsequent gradual cooling of the various elements will be effected in a part of the housing that may be divided into several sections, which are in communication with each other via narrow passages, in which part the links are moved along the lower horizontal path.

The starting and stopping of the device according to the second embodiment can take place in a similar manner as explained with reference to the first embodiment.

Because the links are unconnected between the inlet and the outlet of said housing in this embodiment, it is also possible, however, to include one or more closed links in the conveying element when the device is started, and/or to include one or more links provided with large passages in the conveying element when the device is stopped.

Another important advantage of the fact that the links are unconnected between the inlet and the outlet of said housing is that this significantly facilitates the placing of the plate-shaped elements and/or the substrates, since this can take place whilst the links are stationary. It is possible thereby to use similar means as described above with reference to FIGS. 11 and 12. It is also possible, however, to use an embodiment such as the one that is diagrammatically illustrated in FIG. 22 for supplying and/or discharging plate-shaped elements and substrates.

Said figure diagrammatically illustrates the aforesaid housing 70, which, as explained above, surrounds the conveying element along a large part of its length, and which is inter alia provided with means for subjecting the solder balls to a heat treatment. Said housing is thereby sealed by the aforesaid lock mechanisms 35 and 36 at one end, and by the aforesaid lock mechanisms 37 and 38 at the other end.

In this embodiment a link 34 carrying a plate-shaped element and a substrate, which has been discharged from housing 70 via lock mechanism 37, 38, is placed on a turntable 71 by means not shown, by means of which turntable link 34 can be turned through an angle of 90°.

Then the substrate and the plate-shaped element can be moved to a station 72, in which the plate-shaped element and the substrate are separated.

Following that, the substrate can be carried through further stations 73 for inspection of the substrate. Substrates which exhibit faults may be stored in a magazine 74, for example, so as to be discharged for final processing or the like, whilst the approved substrates may be stored in magazines 75.

The plate-shaped elements may be stored in magazines 76.

Empty links may be stored in an intermediate station 77, which is disposed on the side of turntable 71 that faces away from lock mechanism 37, 38. Furthermore a link 78 may be disposed in said station 77, which link is provided with a large opening, and which is used for the above-described stopping of the operation of the device, as well as for example an entirely closed link, which is used when starting the device as described above.

Substrates which are yet to be provided with solder balls may be stored in magazines 79. If desired, said substrates may be carried through a station 80, in which a flux may be applied to the connecting points, and through a station 81, in which the substrates may be subjected to a drying treatment.

The plate-shaped elements and the substrates on which the solder balls are to be provided may be joined in a station 82. From said station a combination of a plate-shaped element and a substrate thus formed is placed into a link 34 which is present on a further turntable 83 which is disposed on the side of station 77 remote from turntable 71.

After a combination of a plate-shaped element and a substrate has thus been placed into the link, said link is turned through 90 again by means of turntable 83, and subsequently introduced into housing 70 again via lock mechanism 35, 36.

Although it has been generally assumed in the foregoing that one plate-shaped element is provided for each link, it will be apparent that it is also possible within the spirit and scope of the invention to provide more than one plate-shaped element.

Of course further additions and/or modifications to the above-described embodiments of the device according to the invention are conceivable within the spirit and scope of the invention. Thus it is possible to connect the above-described pins 48 to a respective link 34 in such a manner that they are capable of sliding movement in their longitudinal direction, so that said pins can move between a first position, in which said pins are positioned in recesses present in columns 54 or in holes of an adjacent link so as to interconnect the links, and a second position, in which pins 48 have been retracted from the respective recesses or holes provided in columns 54 of an adjacent link. Suitable means will thereby be provided between the outlet and the inlet of the above-described housing for sliding the respective pins 48 in the described manner at the described places.

Several embodiments will also be conceivable for the lock mechanisms. Thus it is possible to effect a shutting-off of the housing with respect to the surrounding atmosphere by means of lock mechanisms which are built up of a plurality of so-called air knives disposed behind each other, that is, means disposed on either side of the conveying element, via which a pressurized inert gas, for example, is blown in the direction of the conveying element.

Furthermore, in the above-described embodiments the substrates and/or the plate-shaped elements are placed on parts of the conveying element near the upper part of the conveying element, which moves along a horizontal path, whilst the part of the conveying element that moves in a horizontal path under said path extends through the housing, which is provided with means for subjecting the parts moving through the housing to a heat treatment.

It will also be conceivable, however, to design the construction such that the substrates and the plate-shaped elements are supplied to and/or discharged from the conveying element near the part of the conveying element that moves along a lower one of two superposed paths, whilst the part of the conveying element that moves along the upper one of the two superposed horizontal paths moves through the housing, which is provided with the means for subjecting the parts moving through said housing to a heat treatment.

What is claimed is:

1. A method for bonding solder balls to connecting points which are provided on a substrate in a predetermined pattern, wherein the solder balls are placed into holes provided in a plate-shaped element, which holes are each capable of accommodating one solder ball, and which are provided in said plate-shaped element in a pattern which corresponds with the pattern of the connecting points on the substrate, wherein a combination of at least one substrate and a plate-shaped element containing solder balls is passed, by means of a conveying element, through a housing in which the solder balls can be heated to melting temperature, wherein the conveying element is made to move along two paths, one extending above the other, with the aid of guide means, and wherein on a part of the conveying element that follows a first one of said two superposed paths, at least one substrate is placed on a plate-shaped element supported by said conveying element, after which the combination thus formed, which consists of a plate-shaped element and at least one substrate, is moved by the conveying element and turned upside down at a transition to a second one of said two superposed paths, after which it is moved along the second path through the housing, whilst solder balls are supplied to the combination of a plate-shaped element and at least one substrate near the beginning of said second path, in a position of said combination in which the plate-shaped element is at least substantially positioned above said at least one substrate.

2. A method according to claim 1, wherein the conveying element is carried into and out of the housing via lock mechanisms.

3. A method according to claim 1, characterized in that the parts of the conveying element supporting combinations of plate-shaped elements and substrates are moved along a curvilinear path, in such a manner that the combinations move below the level of a centre(s) of curvature of the curvilinear path, whilst solder balls are being placed on the plate-shaped elements of the combinations being moved in this manner.

4. A method according to claim 3, wherein the combination is moved at an angle with a horizontal, at least along part of its curvilinear path, at such a speed that one or more layers of solder balls lying one on top of the other will remain present on the plate-shaped element.

5. A method according to claim 4, wherein the combination is moved at an angle which is equal to or smaller than a natural depositing angle of the solder balls, wherein the natural depositing angle is equal to an angle of incline of an outer surface of a heap of the solder balls deposited on a horizontal plane.

6. A method according to claim 1, wherein the solder balls are deposited onto the plate-shaped element by a dispensing element, to which solder balls are supplied after an oxide film has been removed therefrom.

7. A method according to claim 1, wherein the solder balls are deposited on the plate-shaped element after the solder balls have been deoxidized.

8. A method according to claim 1, characterized in that parts of the conveying element that are intended for supporting the plate-shaped elements and the substrates are uncoupled from each other prior to the placing of the plate-shaped elements and/or the substrates, and that said parts are coupled together again once said plate-shaped elements and/or said substrates have been placed.

* * * * *